United States Patent
Beaman

(10) Patent No.: US 6,815,372 B2
(45) Date of Patent: Nov. 9, 2004

(54) SPUTTERED INSULATING LAYER FOR WORDLINE STACKS

(75) Inventor: Kevin L. Beaman, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 10/640,860

(22) Filed: Aug. 14, 2003

(65) Prior Publication Data

US 2004/0067629 A1 Apr. 8, 2004

Related U.S. Application Data

(63) Continuation of application No. 10/100,397, filed on Mar. 18, 2002, now Pat. No. 6,617,262, which is a continuation of application No. 09/653,596, filed on Aug. 31, 2000, now Pat. No. 6,455,441.

(51) Int. Cl.⁷ .............................................. H01L 21/31
(52) U.S. Cl. ........................................ 438/778; 438/758
(58) Field of Search ................................. 438/778, 758

(56) References Cited

U.S. PATENT DOCUMENTS

| | | | |
|---|---|---|---|
| 5,210,047 A | * 5/1993 | Woo et al. | 438/257 |
| 5,266,516 A | 11/1993 | Ho | 437/57 |
| 5,554,488 A | 9/1996 | Rioux | 430/315 |
| 5,633,189 A | 5/1997 | Yen et al. | 438/600 |
| 5,926,740 A | 7/1999 | Forbes et al. | 438/763 |
| 6,008,078 A | 12/1999 | Zhang | 438/164 |
| 6,015,997 A | 1/2000 | Hu et al. | 257/412 |
| 6,177,302 B1 | 1/2001 | Yamazaki et al. | 438/158 |
| 6,190,957 B1 | 2/2001 | Mochizuki et al. | 438/240 |
| 6,198,144 B1 | 3/2001 | Pan et al. | 257/412 |
| 6,449,525 B1 | 9/2002 | Liu et al. | 700/121 |
| 6,724,054 B1 | * 4/2004 | Kang et al. | 257/407 |

OTHER PUBLICATIONS

Van Zant, Peter, Microchip Fabrication: A Practical Guide to Semiconductor Processing, Fourth Edition, 2000, pp. 411–416.

Wolf, Stanley, et al., *Aluminum Thin Films and Physical Vapor Deposition in ULSI*, Silicon Processing for the VLSI Era, vol. 1: Process Technology, Second Edition, Chapter 11, pp. 34–487, 2000.

Aronson, Arnold J., *Fundamentals of Sputtering*, Microelectronic Manufacturing and Testing, Jan. 1987, vol. 10, No. 1, pp. 22–23.

Wolf, Stanley, et al., Silicon Processing for the VLSI Era, vol. 1: Process Technology, 1986, pp. 335–374.

* cited by examiner

*Primary Examiner*—David Nelms
*Assistant Examiner*—Thao P. Le
(74) *Attorney, Agent, or Firm*—Whyte Hirschboeck Dudek SC

(57) ABSTRACT

Insulating material is deposited onto a gate dielectric surface separating two wordline stacks, the method comprising the steps of:

A. Forming at least two adjacent wordline stacks over a common gate dielectric, the stacks spaced apart from one another thereby forming an open surface on the gate dielectric between the stacks; and B. Depositing by sputtering the insulating material onto the open surface of the gate dielectric separating the two wordline stacks.

24 Claims, 3 Drawing Sheets

SPUTTERED INSULATING LAYER FOR WORDLINE STACKS

This application is a continuation of U.S. Pat. No. 10/100,397 filed on Mar. 18, 2002, now U.S. Pat. No. 6,617,262, which is a continuation of U.S. Pat. No. 09/653,596 filed on Aug. 31, 2000, now U.S. Pat. No. 6,455,441.

FIELD OF THE INVENTION

This invention relates to the field of semiconductor device fabrication. In one aspect, the invention relates to the manufacture of a wordline stack while in another aspect, the invention relates to forming an insulating layer on the top surface of the stack. In yet another aspect, the invention relates to depositing the insulating layer on the wordline stack through the use of sputtering technology.

BACKGROUND OF THE INVENTION

Dynamic random access memory (DRAM) devices comprise, among other things, a large plurality of wordline stacks, also known as gate electrode stacks. The function of these stacks is to store a charge and when used in combination with a bit or digit line, provide an "address" for a discrete memory cell. The typical wordline stack is a layered composite of various materials, the top layer of which is typically a silicate glass, e.g., borophosphosilicate glass (BPSG).

The preparation of a DRAM device involves one or more heat annealing steps in which the temperature is such that the dopants, e.g., boron, phosphorus, arsenic, etc., of a doped material, e.g., BPSG, will migrate (or out-gas) from the doped material into the environment (i.e., into the chamber in which the heat annealing step is conducted) and into one or more adjacent layers or other components, e.g., the substrate, of the device. Since the purpose of a dopant is to enhance the conductivity of a material, migration of a dopant into a dielectric material will decrease the insulating properties of that material. If enough dopant migrates into a dielectric material, then the insulating properties of the material will be reduced to the point that a short circuit can develop between the conductive layers separated by the dielectric layer. This, of course, means that a wordline stack can lose its charge inadvertently and this, in turn, can result in a malfunction of the memory device.

To address this problem, a relatively thick, e.g., 150–300 angstroms, layer of an insulating material (also a dielectric and also known as a liner) is usually deposited adjacent to a layer of doped material. Tetraethylorthosilicate (TEOS) is a commonly used liner for this purpose. Achieving a relatively thick layer of this insulating material using conventional chemical vapor deposition (CVD) techniques is not difficult for top-level stack surfaces, but it can be problematic for the surfaces between two stacks. If the aspect ratio, i.e., the height of the stacks (the height of all of the stacks is, for all intent and purpose, essentially the same at the time a blanketing layer of insulating material is deposited) over the distance between the stacks, is relatively low, e.g., less than 3, then conventional CVD techniques will deposit a layer of insulating material of substantially the same thickness between two stacks as is deposited on the top of the stacks. However, as this aspect ratio increases, i.e., the distance between the stacks narrows, the thickness of the insulating layer deposited by conventional CVD between two stacks decreases relative to the thickness of the insulating surface deposited on the top layer of the stacks. At some point, insufficient insulating material is deposited between the two stacks to provide an effective block against the migration of dopants from a material overlying the insulating layer to a material underlying the insulating layer.

As the density of wordline stacks increase on a substrate, the space between individual stacks will inevitably decrease. As this space decreases, the need for cleaner production methods increases, including the need to block the migration of dopants from a doped material to a dielectric material during the heat annealing steps of the memory device. This increases the need for adequate deposition of liners between wordline stacks during the preparation of semiconductor memory devices and other integrated circuits.

SUMMARY OF THE INVENTION

According to this invention, a liner that is an effective block against the migration of a dopant from a doped material to a dielectric material is positioned between the two materials by sputtering. In one embodiment of this invention, an insulating material is deposited onto a gate dielectric surface separating two wordline stacks, the method comprising the steps of:

A. Forming at least two adjacent wordline stacks over a common gate dielectric, the stacks spaced apart from one another thereby forming an open surface on the gate dielectric between the stacks; and B. Depositing by sputtering the insulating material onto the open surface of the gate dielectric separating the two wordline stacks.

In another embodiment of this invention, an insulating material is deposited onto a gate dielectric surface separating two wordline stacks, each wordline stack having a top surface, the insulating material deposited as a layer onto the dielectric surface at a thickness that is substantially the same as the thickness of the insulating layer that is deposited as a layer onto the top of the stacks, the method comprising the steps of:

A. Forming at least two adjacent wordline stacks over a common gate dielectric, the stacks spaced apart from one another thereby forming an open surface on the gate dielectric between the stacks; and B. Depositing by sputtering the insulating material as a layer onto the top of the two stacks and the open surface of the gate dielectric separating the two wordline stacks.

In still another embodiment of this invention, an insulating material is deposited onto a gate dielectric surface separating two wordline stacks, each wordline stack having a top surface and at least one side wall, the insulating material deposited as a layer onto the dielectric surface (i) at a thickness that is substantially the same as the thickness of the insulating layer that is deposited as a layer onto the top of the stacks, and (ii) without any substantial deposition of the insulating material onto the side walls of the stacks, the method comprising the steps of:

A. Forming at least two adjacent wordline stacks over a common gate dielectric, the stacks spaced apart from one another thereby forming an open surface on the gate dielectric between the stacks; and B. Depositing by sputtering the insulating layer onto the top of the two stacks and the open surface of the gate dielectric separating the two wordline stacks without any substantial deposition of the insulating material onto the side walls of the stacks.

BRIEF DESCRIPTION OF THE DRAWINGS

Preferred embodiments of the invention are described below with reference to the following accompanying drawings, which are for illustrative purposes only. In the figures like numerals are employed to designate like parts throughout the same.

DESCRIPTION OF THE PREFERRED EMBODIMENT

Figure 1A:
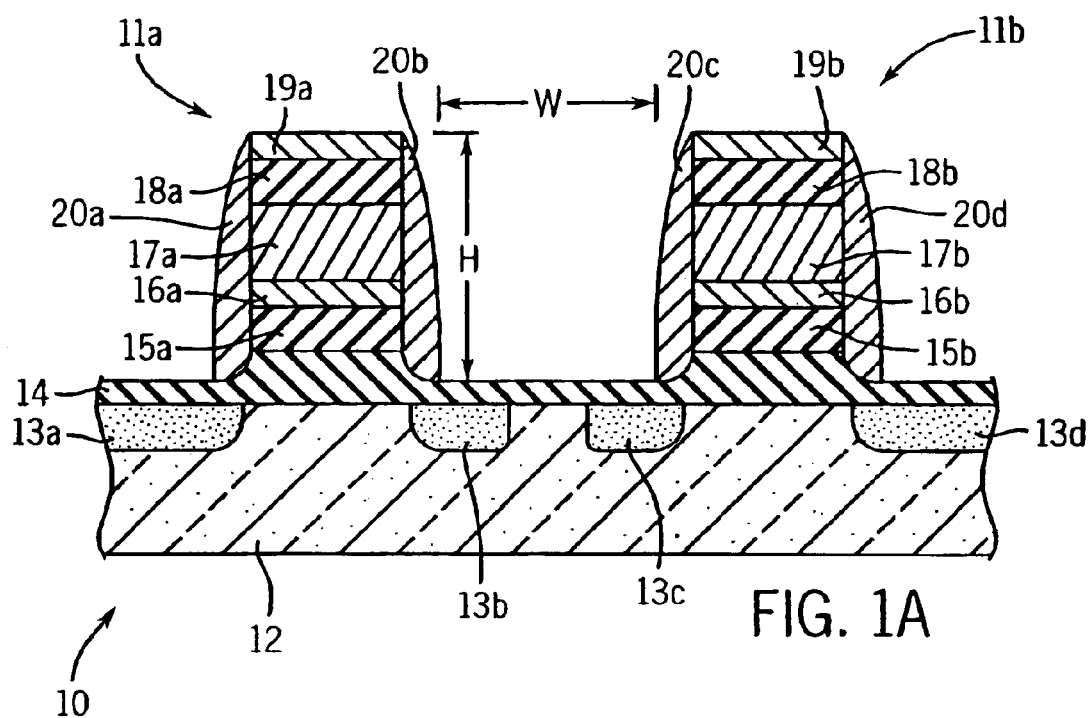
FIG. 1A is a diagrammatic cross-sectional view of a semiconductor wafer fragment bearing two adjacent but separated wordline stacks (prior art).

FIG. 1A is a diagrammatic cross-sectional view of a semiconductor wafer fragment 10 bearing two adjacent but separated wordline stacks 11a and 11b. Semiconductor substrate 12 typically comprises monocrystalline silicon with regions 13a–d sufficiently doped with boron, phosphorus, arsenic or other dopant to operate efficiently as sources and drains for the stacks. Each stack is separated from substrate 12 by gate dielectric 14, which is typically formed by oxidation of substrate 12. Gate dielectric 14 covers essentially all of substrate 12, and is thus common or shared by both wordline stacks.

The wordline stacks 11a, 11b comprise polysilicon layers 15a–b, conductive barrier layers 16a–b, metal layers 17a–b, silicon dioxide layers 18a–b, nitride cap layers 19a–b, and spacer (i.e., side wall) nitride layers 20a–d, respectively. Barrier layers 16a–b are essentially impermeable to silicon and metal atoms under manufacturing and operating conditions, and can include tungsten or titanium nitride. Metal layers 17a–b are typically a metal or alloy of aluminum, copper, tungsten, titanium, platinum, palladium, cobalt, molybdenum, nickel, rhodium and/or iridium. The cap and spacer nitride layers typically comprise silicon nitride.

The wordline stacks are constructed using conventional techniques. Typically, the materials for the polysilicon layer, the barrier layer, the metal layer, the silicon dioxide and nitride layers are alternatively deposited as blanket layers and etched to form the stacks. The wordline stacks have a height h and the open surface on the gate dielectric between the stacks has a width w, the height h and width w defining an aspect ratio of h/w of at least about 2, preferably at least about 2.5 and more preferably at least about 3. Since nitride spacers are usually components of a wordline stack, width w is usually measured from the external surface of one nitride spacer to the external surface of an opposing nitride spacer, e.g., from the external surface of 20b to the external surface of 20c. Height h is usually measured from the exposed surface of the gate dielectric to the exposed surface of the top layer of a stack, e.g., from the exposed surface of gate dielectric 14 to the top surface of nitride cap layer 19a or 19b.

Figure 1B:
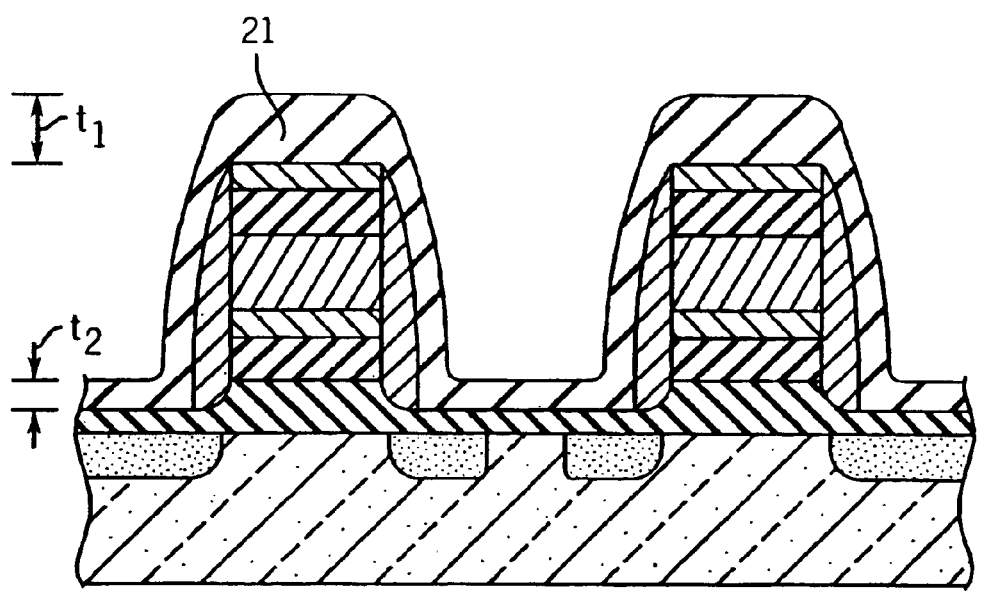
FIG. 1B is the diagrammatic cross-sectional view of the semiconductor wafer fragment of FIG. 1 but covered with a continuous TEOS layer deposited by LPCVD (prior art).
Figure 1C:
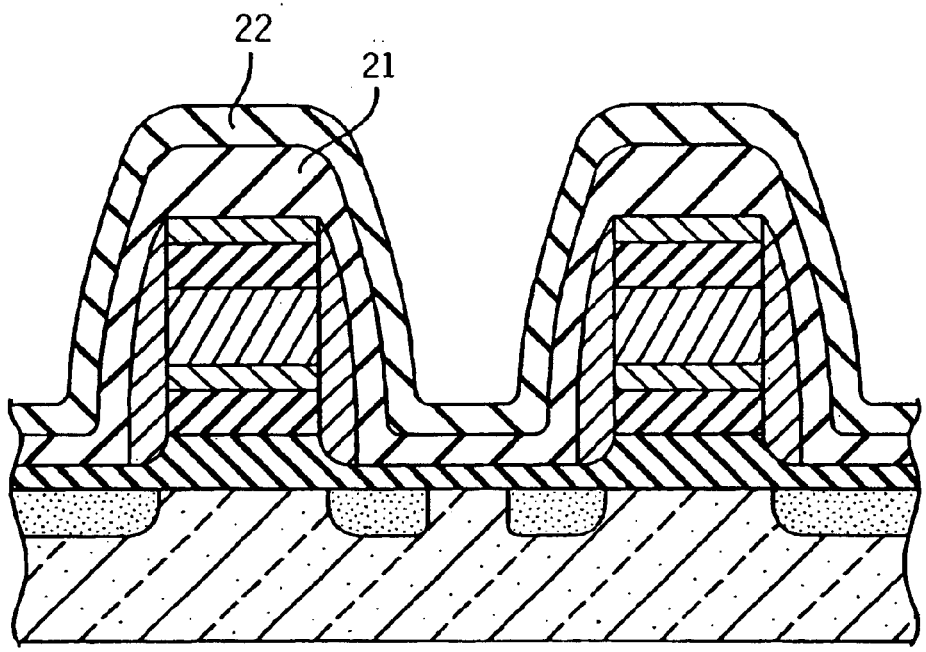
FIG. 1C is the diagrammatic cross-sectional view of a semiconductor wafer fragment of FIG. 1B but covered with a continuous BPSG layer (prior art).

Word line stacks 11a and 11b are designed as components for a semiconductor memory device and in this regard, are ultimately coated with a doped oxide insulator layer, typically BPSG. Because boron and phosphorus will migrate from the BPSG layer to the layers underlying it (e.g., dielectric gate 14 and/or substrate 12) during the heat annealing steps of the memory device manufacture, an insulation layer, typically oxide formed using TEOS, is placed between the doped oxide layer and the underlying layers. This conventional practice is illustrated in FIGS. 1B and 1C.

TEOS insulation layer or liner 21 is typically deposited upon the exposed surfaces of the semiconductor wafer of FIG. 1A such that it overlays nitride layers 19a–b, nitride spacers 20a–d and dielectric gate 14. The TEOS is typically deposited by low pressure chemical vapor deposition (LPCVD) but due to the nature of LPCVD deposition and the presence of the spacer nitride on the stack side walls, the amount of TEOS deposited on the surface of dielectric gate 14 between the stacks is less than the amount of TEOS deposited upon the exposed surfaces of nitride layers 19a–b. Referring to FIG. 1B, in terms of layer thickness, thickness $t_2$<thickness $t_1$, typically much less. If the thickness of the TEOS layer over the dielectric gate is inadequate, e.g., less than 150 angstroms, then the TEOS layer is likely to allow some migration of dopant from the BPSG layer into the dielectric gate layer.

Figure 2A:
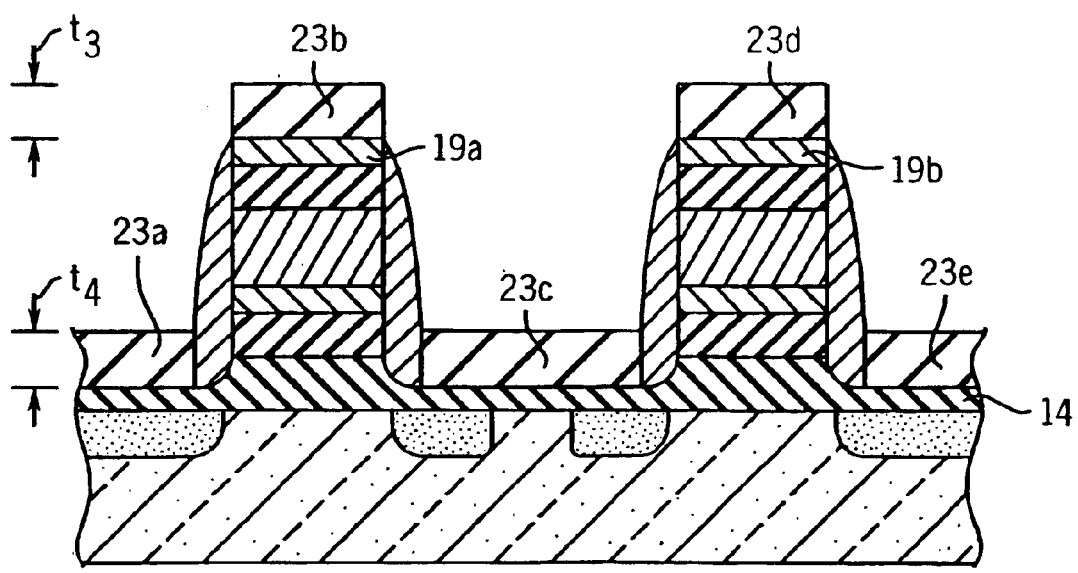
FIG. 2A is the diagrammatic cross-sectional view of the semiconductor wafer fragment of FIG. 1A but covered with a discontinuous silicon dioxide layer deposited by sputtering, according to an embodiment of the method of the invention.

Referring to FIG. 2A, insulating layers 23a–e are deposited onto the exposed surfaces of dielectric gate 14 and nitride layers 19a–b by any conventional sputtering technique, e.g., high density plasma (HDP) or collimated. These and other sputtering techniques (also known as physical vapor deposition) are well known in the art. Wolf and Tauber, *Silicon Processing for the VLSI Era*, Vol. 1, Chpt. 11, (Lattice Press 2000); Zant, *Microchip Fabrication*, pp.411–16 (McGraw-Hill 2000); and Aronson, "Fundamentals of Sputtering", *Microelectronics Manufacturing and Testing*, January 1987. An exemplary conventional sputtering process is the sputtering of aluminum for metal interconnects.

Sputtering allows for the deposition of insulating layers 23a–e with little, if any, deposition of insulating material on the sidewalls of the stacks. This, in turn, allows for the deposition of a layer with a more uniform thickness across the exposed surfaces of the wordline stacks and their supporting dielectric gate. As shown in FIG. 2A, thickness $t_4$ is substantially equal to thickness $t_3$, i.e., $t_4=t_3$. Of course, the higher the aspect ratio of the space between the stacks, the more $t_4$ is likely to be less than $t_3$. Preferably, the aspect ratio of space between the stacks is less than about 4, more preferably less than about 3.75, and most preferably less than about 3.5.

In one preferred embodiment of this invention, insulating layers 23a–e are one of silicon dioxide ($SiO_2$) or silicon nitride ($Si_3N_4$). Other insulators of interest include boron nitride (BN), tungsten nitride (WN), and aluminum oxide ($Al_2O_3$). The temperature during formation of the insulating layer is sufficiently low so that little or none of the barrier and metal layers of the wordline stacks is converted to an oxide. For example, if the barrier layer comprises tungsten nitride and the metal layer comprises tungsten, then the insulating layer can be formed at a temperature in range of about 30 to about 650C.

Figure 2B:
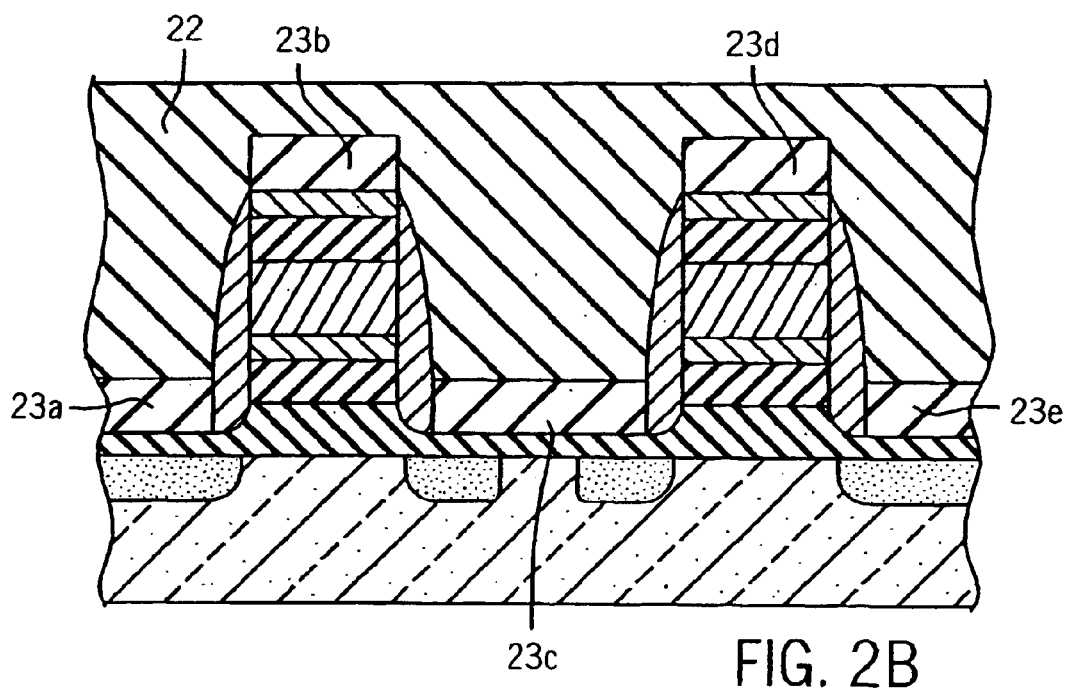
FIG. 2B is the diagrammatic cross-sectional view of the semiconductor wafer fragment of FIG. 2A but covered with a continuous BPSG layer.
Figure 2C:
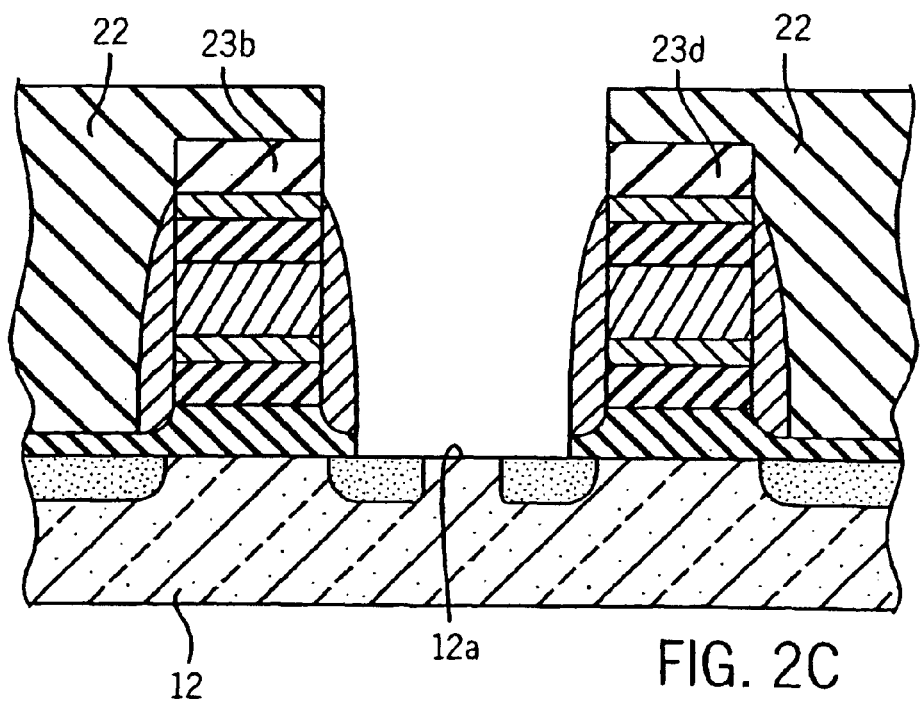
FIG. 2C is the diagrammatic cross-sectional view of the semiconductor wafer fragment of FIG. 2B after a select portion of the BPSG and silicon dioxide layers are removed by an anisotropic etch.

After insulating layers 23a–e are applied, a doped oxide insulating layer 22, e.g., BPSG, is applied to all the exposed surfaces of wafer 10 (FIG. 2B), and then the wafer is subjected to a standard photolithographic mask and etch process to remove insulating layers 23a–c–e, doped oxide insulating layer 22 (except from the surface of nitride layers 19a–b (FIG. 2C)), and the portion of gate dielectric 14 between stacks 11a and 11b. Subsequently, a contact (not shown) is made on substrate 12 at surface 12a (i.e., the surface between stacks 11a and 11b).

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents. Other embodiments of this invention are within the scope of the following claims.

What is claimed is:

1. A method of fabricating a semiconductor device, comprising the steps of:

sputter depositing an insulating layer onto adjacent wordline stacks and a gate dielectric layer disposed on a substrate in an opening between the wordline stacks, the opening defining an aspect ratio of at least about 2;

forming a doped insulating layer over the sputter deposited insulating layer and the wordline stacks; and removing a portion of the doped insulating layer, the sputter deposited insulating layer, and the gate dielectric layer to expose the substrate between the wordline stacks.

2. The method of claim 1, further comprising, after the step of removing the insulating layer, the step of forming a contact within the opening between the wordline stacks.

3. The method of claim 1, wherein the step of removing the insulating layer comprising masking and etching the insulating layers of the gate dielectric layer.

4. A method of fabricating a semiconductor device, comprising the steps of:

sputter depositing an insulating layer to form a discontinuous layer of sputter deposited insulating material on a top surface of adjacent wordline stacks and over a gate dielectric layer disposed on a substrate in an opening between the wordline stacks, the opening defining an aspect ratio of at least about 2;

forming a doped insulating layer over the sputter deposited insulating layer and the wordline stacks;

removing a portion of the doped insulating layer, the sputter deposited insulating layer, and the gate dielectric layer to expose the substrate between the wordline stacks; and forming a contact within the opening between the wordline stacks.

5. A method of fabricating a semiconductor device, comprising the steps of:

sputter depositing an insulating layer to form a discontinuous layer of sputter deposited insulating material on a top surface of adjacent wordline stacks and over a gate dielectric layer disposed on a substrate in an opening between the wordline stacks, the opening defining an aspect ratio of at least about 2, and the sputter deposited insulating layers being substantially the same thickness;

forming a doped insulating layer over the sputter deposited insulating layer and the wordline stacks;

removing a portion of the doped insulating layer, the sputter deposited insulating layer, and the gate dielectric layer to expose the substrate between the wordline stacks; and forming a contact within the opening between the wordline stacks.

6. A method of fabricating a semiconductor device, comprising the steps of:

sputter depositing an insulating layer to form a discontinuous layer of sputter deposited insulating material on a top surface of adjacent wordline stacks and over a gate dielectric layer disposed on a substrate in an opening between the wordline stacks, the opening defining an aspect ratio of at least about 2; the insulating material selected from the group consisting of silicon dioxide, silicon nitride, and boron nitride, and the sputter deposited insulating layer disposed on the gate dielectric layer having a thickness substantially the same as the sputter deposited insulating layer disposed on the top surface of the wordline stacks;

forming a doped insulating layer over the sputter deposited insulating layer and the wordline stacks; and removing a portion of the doped insulating layer, the sputter deposited insulating layer, and the gate dielectric layer to expose the substrate between the wordline stacks.

7. A method of fabricating a semiconductor device, comprising the steps of:

sputter depositing an insulating layer to form a discontinuous layer of sputter deposited insulating material on a top surface of adjacent wordline stacks and over a gate dielectric layer disposed on a substrate in an opening between the wordline stacks without a substantial amount of the sputter deposited insulating material deposited on the sidewalls of the stacks, the opening defining an aspect ratio of at least about 2; the insulating material selected from the group consisting of silicon dioxide, silicon nitride, and boron nitride, and the sputter deposited insulating layers being substantially the same thickness;

forming a doped insulating layer over the sputter deposited insulating layer and the wordline stacks; and removing a portion of the doped insulating layer, the sputter deposited insulating layer, and the gate dielectric layer to expose the substrate between the wordline stacks.

8. A method of fabricating a semiconductor device, comprising the steps of:

sputter depositing an insulating layer to form a discontinuous layer of sputter deposited insulating material on a top surface of adjacent wordline stacks and over a gate dielectric layer disposed on a substrate in an opening between the wordline stacks without a substantial amount of the sputter deposited insulating material deposited on the sidewalls of the stacks, the opening defining an aspect ratio of at least about 2; the insulating material selected from the group consisting of silicon dioxide, silicon nitride, and boron nitride, and the sputter deposited insulating layers being substantially the same thickness of at least about 150 angstroms;

forming a doped insulating layer over the sputter deposited insulating layer and the wordline stacks; and removing a portion of the doped insulating layer, the sputter deposited insulating layer, and the gate dielectric layer to expose the substrate between the wordline stacks.

9. The method of claim 8, wherein the thickness of the sputter deposited insulating layers is about 150–300 angstroms.

10. The method of claim 8, wherein the doped insulating layer comprises a doped oxide.

11. The method of claim 10, wherein the doped oxide insulating layer comprises borophosphosilicate glass.

12. A method of fabricating a semiconductor device, comprising the steps of:

sputter depositing an insulating layer to form a discontinuous layer of sputter deposited insulating material on a top surface of adjacent wordline stacks and over a gate dielectric layer disposed on a substrate in an opening between the wordline stacks without a substantial amount of the sputter deposited insulating material deposited on the sidewalls of the stacks, the opening defining an aspect ratio of at least about 2; the insulating material selected from the group consisting of silicon dioxide, silicon nitride, boron nitride, tungsten nitride, and aluminum oxide, and the sputter deposited insulating layers being substantially the same thickness of at least about 150 angstroms;

forming a doped insulating layer over the sputter deposited insulating layer and the wordline stacks; and removing a portion of the doped insulating layer, the sputter deposited insulating layer, and the gate dielectric layer to expose the substrate between the wordline stacks.

13. A method of fabricating a semiconductor device, comprising the steps of:

depositing an insulating layer by collimated sputtering to form a discontinuous layer of sputter deposited insulating material on a top surface of adjacent wordline stacks and over a gate dielectric layer disposed on a substrate in an opening between the wordline stacks;

forming a doped insulating layer over the sputter deposited insulating layer and the wordline stacks;

removing a portion of the doped insulating layer, the sputter deposited insulating layer, and the gate dielectric layer to expose the substrate between the wordline stacks; and forming a contact within the opening between the wordline stacks.

14. An integrated circuit, comprising:

at least two adjacent wordline stacks disposed over a gate dielectric disposed over a substrate, each wordline stack having a top surface and sidewalls, and the wordline stacks spaced apart from one another with an opening therebetween, with the substrate between the wordline stacks and the sidewalls of the wordline stacks within the opening being exposed, the opening defining an aspect ratio of at least about 2;

a layer of a sputter deposited insulating material disposed on the top surface of each stack, the sputter deposited insulating material selected from the group consisting of silicon dioxide, silicon nitride, and boron nitride; and a doped oxide insulating layer disposed over the sputter deposited insulating layers and the sidewalls of the wordline stacks not exposed within the opening.

15. The integrated circuit of claim 14, further comprising a contact disposed within the opening.

16. An integrated circuit, comprising:

at least two adjacent wordline stacks disposed over a gate dielectric disposed over a substrate, each wordline stack having a top surface and sidewalls, and the wordline stacks spaced apart from one another with an opening therebetween, with the substrate between the wordline stacks and the sidewalls of the wordline stacks within the opening being exposed, the opening defining an aspect ratio of at least about 2;

a layer of a sputter deposited insulating material disposed on the top surface of each stack without any substantial amount of said insulating material disposed on the sidewalls of the wordline stacks, the sputter deposited insulating material selected from the group consisting of silicon dioxide, silicon nitride, and boron nitride; and a doped oxide insulating layer disposed over the sputter deposited insulating layers and the sidewalls of the wordline stacks not exposed within the opening.

17. An integrated circuit, comprising:

at least two adjacent wordline stacks disposed over a gate dielectric disposed over a substrate, each wordline stack having a top surface, sidewalls, and nitride spacers disposed on the sidewalls, the wordline stacks spaced apart from one another with an opening therebetween, with the substrate between the wordline stacks and the sidewalls of the wordline stacks within the opening being exposed; the opening defining an aspect ratio of at least about 2;

a layer of a sputter deposited insulating material disposed on the top surface of each stack, the sputter deposited insulating material selected from the group consisting of silicon dioxide, silicon nitride, and boron nitride;

a doped oxide insulating layer disposed over the sputter deposited insulating layers and nitride spacers disposed on the sidewalls of the wordline stacks not exposed within the opening; and a contact disposed within the opening.

18. An integrated circuit, comprising:

at least two adjacent wordline stacks disposed over a gate dielectric, each wordline stack having a top surface and sidewalls, and the wordline stacks spaced apart from one another with an opening therebetween; the opening defining an aspect ratio of at least about 2; and a discontinuous layer of a sputter deposited insulating material disposed on the top surface of each stack and on the gate dielectric within the opening, the insulating material selected from the group consisting of silicon dioxide, silicon nitride, and boron nitride;

a doped oxide insulating layer disposed over the sputter deposited insulating layers on the top surfaces of the wordline stacks and the sidewalls of the wordline stacks not exposed within the opening; and a contact disposed within the opening.

19. A semiconductor device, comprising: a liner disposed between a doped material layer and a dielectric layer, the liner comprising a layer of sputter deposited insulating material selected from the group consisting of silicon dioxide, silicon nitride, and boron nitride.

20. The semiconductor device of claim 19, wherein the liner is disposed on a surface of a substrate within an opening defining an aspect ratio of at least about 3.

21. The semiconductor device of claim 19, wherein the liner is disposed on a surface of a substrate within an opening between two wordline stacks, the opening defining an aspect ratio of at least about 2.

22. The semiconductor device of claim 19, wherein the liner is about 150–300 angstroms thick.

23. A dynamic random access memory device comprising the integrated circuit of claim 14.

24. A dynamic random access memory device comprising the semiconductor device of claim 19.

* * * * *